United States Patent [19]

Takemi et al.

[11] Patent Number: 5,800,622
[45] Date of Patent: Sep. 1, 1998

[54] VAPOR-PHASE GROWTH APPARATUS AND COMPOUND SEMICONDUCTOR DEVICE FABRICATED THEREBY

[75] Inventors: Masayoshi Takemi; Yuji Ohkura, both of Tokyo, Japan

[73] Assignee: Mitsubishi Denki Kabushiki Kaisha, Tokyo, Japan

[21] Appl. No.: 593,964

[22] Filed: Jan. 30, 1996

[30] Foreign Application Priority Data

Jul. 21, 1995 [JP] Japan ................... 7-186090

[51] Int. Cl.$^6$ .................................. C23C 16/00
[52] U.S. Cl. .................. 118/725; 118/728; 118/730
[58] Field of Search ...................... 118/728, 730, 118/725

[56] References Cited

U.S. PATENT DOCUMENTS

| | | | |
|---|---|---|---|
| 3,539,759 | 11/1970 | Spiro | 118/719 |
| 4,780,174 | 10/1988 | Lan | 118/725 |
| 4,978,567 | 12/1990 | Miller | 118/725 |
| 4,986,215 | 1/1991 | Yamada | 118/728 |
| 5,074,017 | 12/1991 | Toya | 118/730 |
| 5,152,842 | 10/1992 | Urata | 118/730 |
| 5,226,383 | 7/1993 | Bhat | 118/730 |
| 5,242,501 | 9/1993 | McDiarmid | 118/728 |
| 5,551,983 | 9/1996 | Shepard | 118/730 |
| 5,556,476 | 9/1996 | Lei | 118/728 |

FOREIGN PATENT DOCUMENTS

| | | |
|---|---|---|
| 2711274 | 4/1995 | France . |
| 3943360 | 7/1990 | Germany . |
| 60-263428 | 12/1985 | Japan . |
| 63-244613 | 10/1988 | Japan . |
| 1206618 | 8/1989 | Japan . |
| 1291421 | 11/1989 | Japan . |
| 1256118 | 12/1989 | Japan . |
| 268922 | 3/1990 | Japan . |
| 2186623 | 7/1990 | Japan . |
| 3291916 | 12/1991 | Japan . |
| 7161648 | 6/1995 | Japan . |

OTHER PUBLICATIONS

Fair, Rapid Thermal processing, Academic Press, ©1993, pp. 361–362.

*Primary Examiner*—Richard Bueker
*Attorney, Agent, or Firm*—Leydig, Voit & Mayer, Ltd.

[57] ABSTRACT

In a thermal radiation type substrate heating system of an MOCVD growth apparatus, a susceptor includes a semi-circular concavity is formed in each of wafer pockets at the forward area in a wafer rotation direction so that P-richness in a crystalline film grown at the gas upstream area is suppressed. Specifically, the conventional wafer holder exhibits a non-uniform temperature distribution so that the surface temperature is high at the gas upstream area and low at the downstream area. On the other hand, the structure according to the present invention realizes a high temperature at a wafer contact area and a low temperature at a wafer non-contact area, thus leading to a uniform surface temperature over the entire gas upstream and downstream areas.

2 Claims, 7 Drawing Sheets

ROTATION DIRECTION
OF WAFER HOLDER

DIRECTION OF GAS FLOW

VAPOR-PHASE GROWTH APPARATUS AND COMPOUND SEMICONDUCTOR DEVICE FABRICATED THEREBY

BACKGROUND OF THE INVENTION

The present invention relates to a vapor-phase growth apparatus provided with a wafer holder for making the surface temperature of a wafer uniform, and more particularly to an MOCVD growth apparatus for growing a crystalline compound semiconductor having a thermal radiation type substrate heating system.

In recent years, it has been confirmed theoretically and experimentally that the device characteristic of a high-speed electronic device such as an optical device and HEMT used in a light source for optical communication and information processing can be greatly improved by adopting a quantum well structure, a super thin film hetero-structure or the like. In order to improve the device characteristic further, it is necessary to make the device thinner and precisely control chemical composition. One promising crystal growth technique for making the hetero-structure and super-thin film structure is MOCVD (Metalorganic Chemical Vapor Deposition).

FIG. 11 is a schematic view of an MOCVD growth apparatus having a thermal radiation type substrate heating system. FIG. 12 is a perspective view showing a conventional wafer holder used in the MOCVD growth apparatus. In FIG. 11, reference numeral denotes a wafer holder of Mo (molybdenum) which serves as a jig for placement of a wafer. Reference numeral 2 denotes one of a plurality of areas where the wafers are placed, respectively, which are circular concavities having a depth of 400 μm or less (hereinafter referred to as "wafer pocket"). This apparatus use substrate heating from a heater (not shown) arranged on the backside of the wafer holder 1 so that a crystal is grown on the wafer while the wafer holder is rotated as shown in FIG. 1. For example, in the MOCVD technique for growing InGaAsP series materials, TMI (Trimethylindium) and TEG (Triethylgallium) are used as source materials for In and Ga, which are Group III elements, and $AsH_3$ and $PH_3$ are used as source materials for As and P which are Group V elements. These materials are thermally decomposed to grow a crystal on a substrate. In recent years, the MOCVD technique has been adopted for a 2-inch circular wafer in place of the conventional process for a square wafer, and so requires uniform composition over a large area.

In a thermal radiation substrate-heating system, the composition (solid phase ratio) changes because of a slight temperature change owing to changes in the thermal decomposition efficiency of the source materials. For example, of growing in the MOCVD technique in InGaAsP series materials, $PH_3$ has a lower thermal decomposition efficiency than $AsH_3$. Specifically, in a lower temperature range, more $AsH_3$ is decomposed, which results in As-richness, whereas in a high temperature range, P-richness results.

On the other hand, as shown in FIG. 13, using the conventional wafer holder provides a non-uniform distribution of the surface temperature in an area from the wafer zone on the wafer holder to the molybdenum-exposed portion on which no wafer is present. Specifically, because of differences in the thermal radiation efficiency, the temperature is high at the periphery of the wafer near the molybdenum-exposed portion and low at the wafer center far from the molybdenum-exposed portion. Thus, the wafer periphery provides a P-rich composition whereas the wafer center provides an As-rich composition. Further, the area confined by the wafer edge does not provide a completely concentric circular temperature distribution. The gas upstream side of the wafer zone, where the temperature is higher than that at a gas downstream side, provides a relatively P-rich composition.

As described above, the thermal radiation substrate heating system using the conventional wafer holder has a disadvantage of providing a non-uniform composition in the grown material because of non-uniformity in temperature distribution on the surface of the wafer holder between the wafer periphery and wafer center and between the gas upstream side and downstream side. For this reason, the number of chips for a semiconductor laser which can be obtained from a single wafer is lower than the number of chips theoretically calculated. This has been an obstacle to reducing the production cost.

SUMMARY OF THE INVENTION

The present invention has been completed in order to solve the above problem described, and intends to provide a vapor-phase growth apparatus, particularly an MOCVD growth apparatus with a thermal radiation substrate system which uses a wafer holder capable of making the surface temperature of the wafer uniform, improving the uniformity of compound semiconductor crystals in the wafer, and reducing the production cost of a compound semiconductor device.

The vapor-phase growth apparatus according to the present invention includes a wafer holder provided in a vapor-phase reactor chamber and having a spot facing on which a wafer is placed horizontally; a concave formed locally in the spot facing; a driving means for rotating the wafer holder; and a wafer heater placed on the backside of the wafer holder.

The vapor-phase growth apparatus includes a wafer holder provided in the vapor-phase reactor chamber and having a spot facing on which a wafer is placed horizontally; a concave formed locally on the backside of the spot facing; a driving means for rotating the wafer holder; and a wafer heater placed on the backside of the wafer holder.

The concave is also formed at a forward region in the rotation direction of the wafer holder.

The vapor-phase growth apparatus according to the present invention includes a wafer holder provided in a vapor-phase reactor chamber and having a spot facing on which a wafer is placed horizontally; a convex formed on the backside of the spot facing; a driving means for rotating the wafer holder; and a wafer heater placed on the backside of the wafer holder.

The convex is formed on the substantially entire zone of the backside of the spot facing.

A compound semiconductor device according to the present invention is fabricated using the vapor phase growth apparatus.

DETAILED DESCRIPTION OF THE PREFERRED EMBODIMENTS (Embodiment 1)

Figure 1:
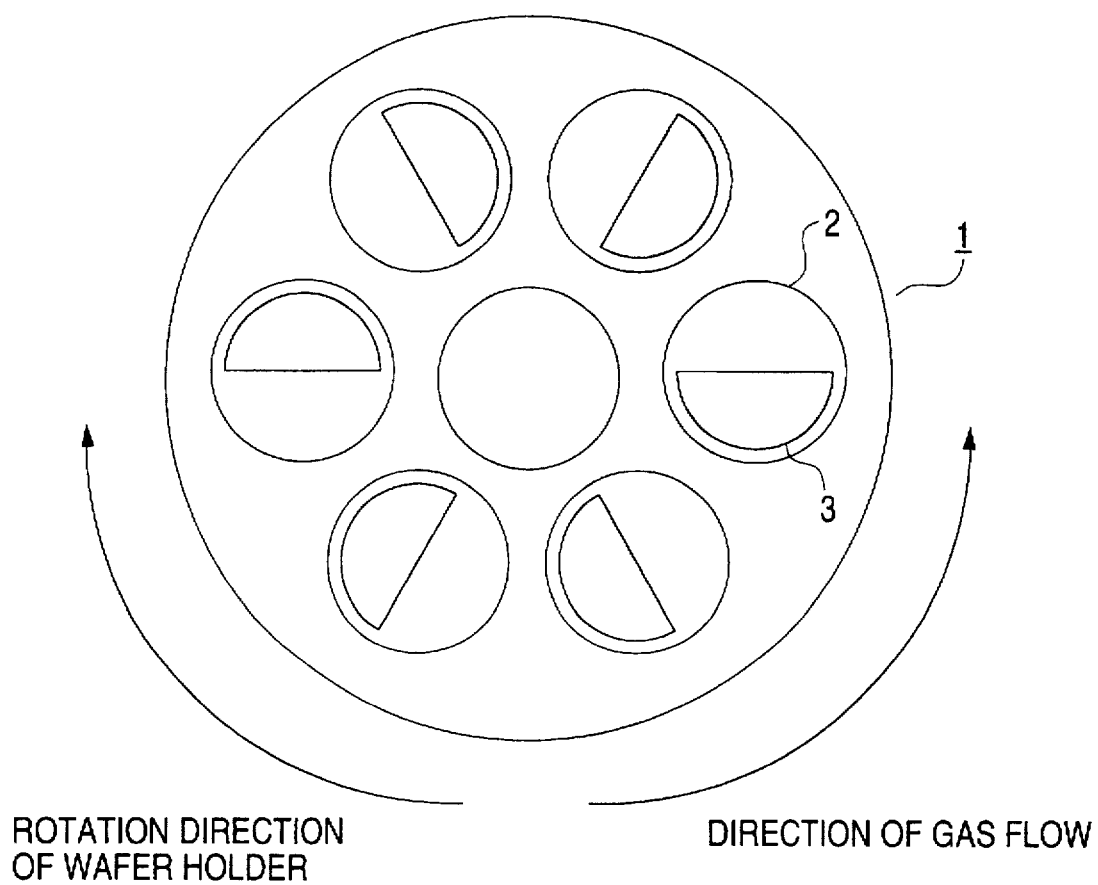
FIG. 1 is a top view showing a wafer holder used in a vapor-phase growth apparatus which is one embodiment of the present invention.
Figure 2:
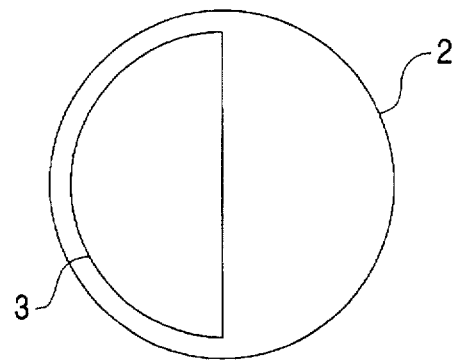
FIG. 2 is a top view showing the shape of a wafer pocket of the wafer holder in the vapor-phase growth apparatus which is one embodiment of the present invention.
Figure 3:
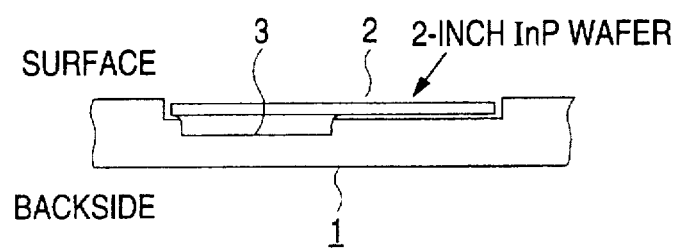
FIG. 3 is a partial sectional view showing the shape of a wafer holder used in the vapor-phase growth apparatus which is one embodiment of the present invention.
Figure 4:
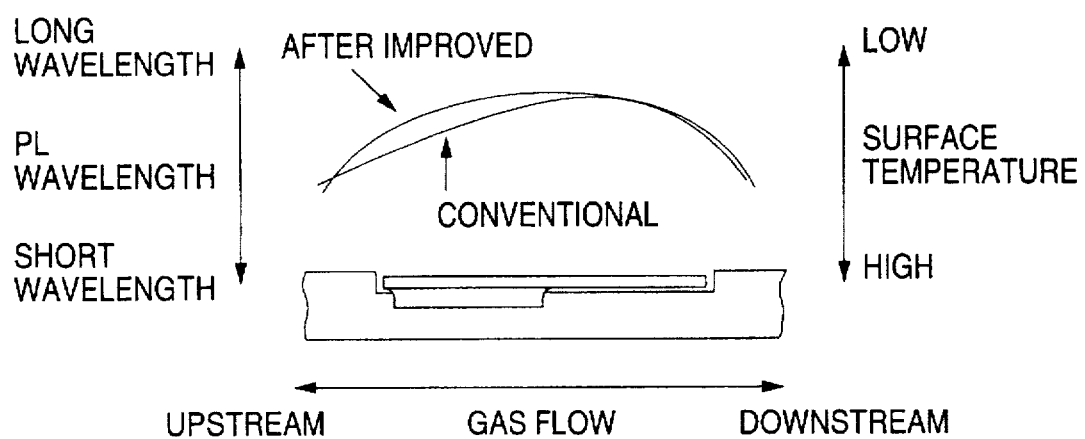
FIG. 4 is a graph showing the profile of the surface temperature of a wafer when the wafer holder is used in the vapor-phase growth apparatus according to a second embodiment of the present invention.

FIG. 1 is a top view showing a wafer holder used in a thermal radiation type substrate heating MOCVD growth apparatus, a vapor-phase growth apparatus which is one embodiment of the present invention. FIG. 2 is a top view showing the shape of a wafer pocket. FIG. 3 is a partial sectional view showing the shape of a wafer holder. In these figures, reference numeral 1 denotes a wafer holder; 2 denotes one of a plurality of wafer pockets; and 3 denotes a semi-circular concavity formed in each of the wafer pockets.

In this embodiment, a semi-circular concavity 3 having a depth of 1 mm or less is formed in each of the wafer pockets 2 at the forward area in a wafer rotation direction so that the P-richness at the gas upstream area is suppressed. Specifically, the conventional wafer holder exhibits a non-uniform temperature distribution so that the surface temperature is high at the gas upstream area and low at the downstream area. On the other hand, in this embodiment, the concavity 3 is formed within the wafer pocket 3 so that a gap is formed between each wafer and the wafer holder 1. This concavity interrupts thermal conduction from a wafer heater set on the backside of the wafer holder, thereby suppressing an increase in the surface temperature of the wafer over the concave area. This realizes a high temperature at a wafer contact area and a low temperature at a wafer non-contact area, thus leading to a uniform surface temperature over the entire gas upstream and downstream areas. This embodiment, therefore, is very efficient for compound semiconductor MOCVD growth which requires very high temperature uniformity ±1° C.

The compound semiconductor crystal formed in the MOCVD apparatus using the wafer holder according to this embodiment is very uniform with a suppressed composition distribution within the wafer. This permits the number of chips of compound semiconductor devices such as semiconductor lasers to be increased, thus contributing to cost reduction.

(Embodiment 2)

Figure 5:
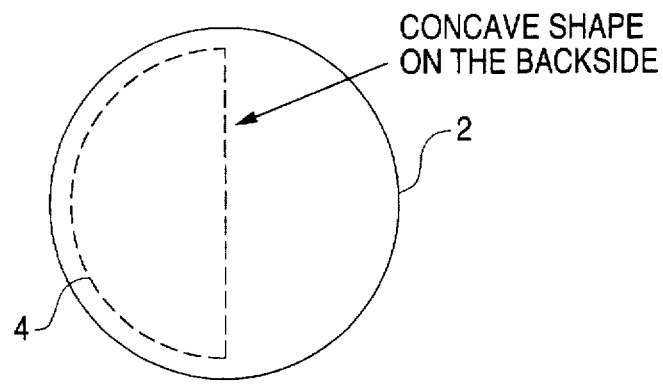
FIG. 5 is a top view showing the shape of each of the wafer pockets of a wafer holder used in the second embodiment of the present invention.
Figure 6:
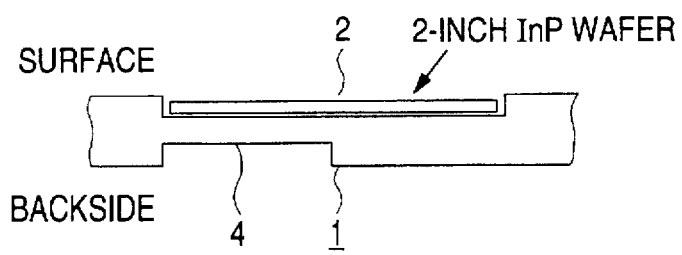
FIG. 6 is a top view of a wafer holder used in a vapor phase growth apparatus according to the second embodiment of the present invention.

FIG. 5 is a top view showing the shape of each of the wafer pockets on a wafer holder used in a thermal radiation type substrate heating MOCVD growth apparatus, which is a second embodiment of the present invention. FIG. 6 is a top view showing the shape of a wafer pocket. In these figures, reference numeral 4 denotes a semi-circular concavity provided on the backside of the wafer holder 1 opposite the wafer pocket 2.

Figure 7:
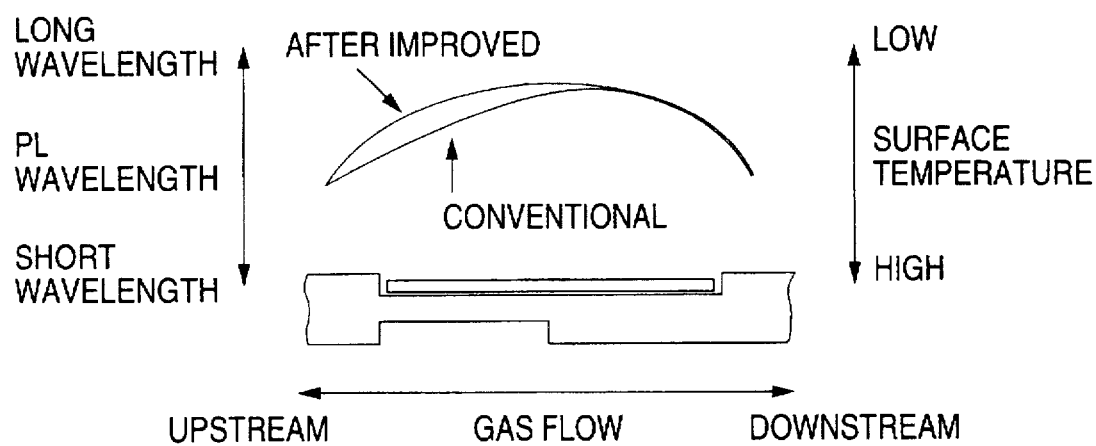
FIG. 7 is a graph showing the profile of the surface temperature of a wafer when the wafer holder is used in the vapor-phase growth apparatus according to the second embodiment of the present invention.

In this embodiment, the semi-circular concavity 4 is formed on the backside of the wafer holder 1 at each of the wafer pockets 2 at the forward area in a wafer rotation direction so that P-richness at the gas upstream area is suppressed. Specifically, the conventional wafer holder exhibits non-uniform temperature distribution so that the surface temperature is high at the gas upstream area and low at the downstream area. On the other hand, in this embodiment, the concavity 4 is formed in the backside of the wafer holder 1 at each of the wafer pockets 2 so that the wafer holder has relatively thick and thin areas. As a result, the thin areas where concavities are formed, are far from the wafer heater placed on the backside of the wafer holder, thereby suppressing an increase in the surface temperature of the wafer over the concave area. This realizes a high temperature at the thick areas and a low temperature at the thin areas, thus leading to a uniform surface temperature over the entire gas upstream and downstream areas, as shown in FIG. 7.

Figure 8A:
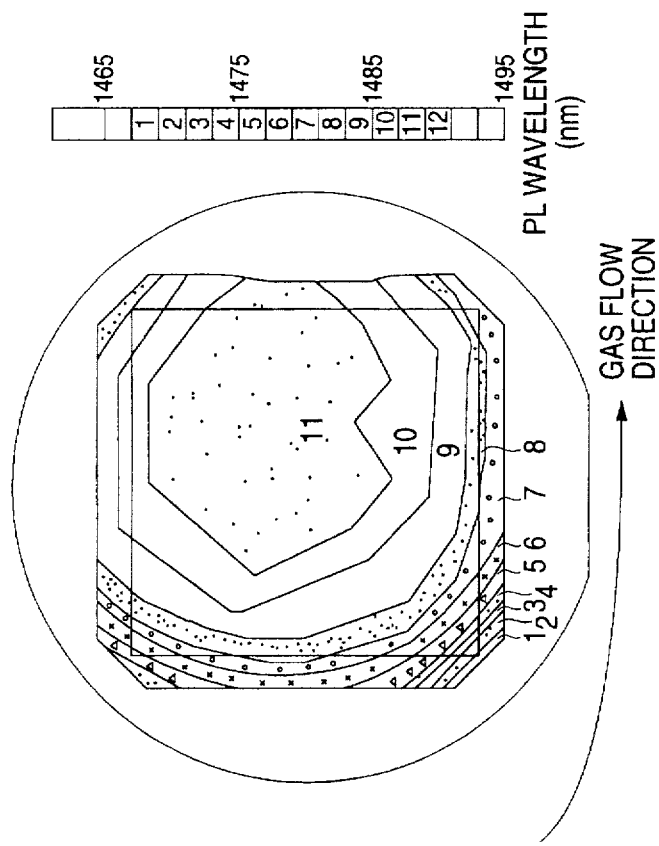
FIGS. 8A and 8B show the distributions of the photoluminescence (PL) wavelengths of a grown film using the wafer holder according to the second embodiment and the conventional wafer holder respectively.
Figure 8B:
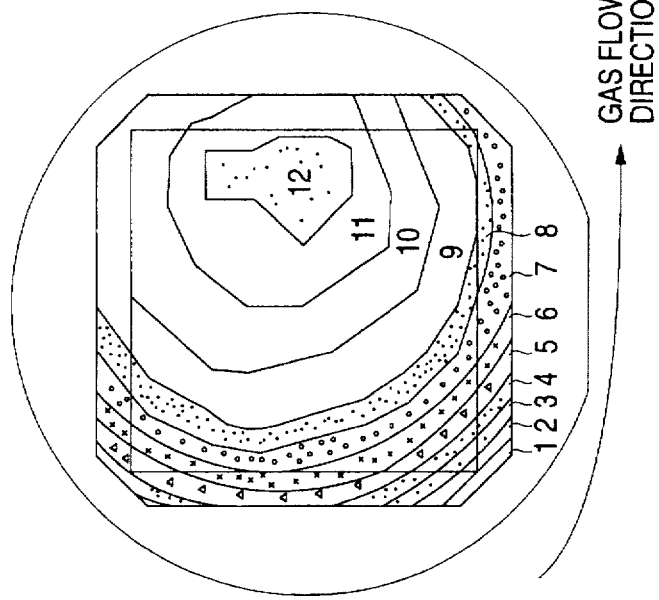

FIGS. 8A and 8B show distributions of the photoluminescence (PL) wavelengths at the wafer surface when the wafer holder according to this embodiment and the conventional wafer holder are used respectively. Specifically, FIGS. 8A and 8B show the photoluminescence (PL) wavelength distribution of an InGaAsP layer within one sheet of wafer. The PL waveform corresponds to the energy gap in the InGaAsP layer. The distribution of the PL wavelengths permits the composition ratio of elements in the InGaAsP layer to be estimated. When an InGaAs layer is grown on an InP substrate, it has been confirmed that the distribution of the compositions of In and Ga are substantially uniform. The PL wavelength distribution, therefore, can be considered as the composition ratio of As and P.

In the PL wavelength distribution when the conventional wafer holder is used as shown in FIG. 8A, the PL wavelength is relatively longer at the wafer center whereas it is relatively shorter in the wafer periphery. In addition, at the gas upstream side, the PL wavelength is shorter whereas at the downstream side, it is longer. When a device is actually fabricated, the entire wafer is not used but a 3 cm square at the wafer center is used. Therefore, it is necessary to improve the PL wavelength distribution in the device area.

The wafer holder according to this embodiment is used to reduce the effective temperature at the gas upstream side so that the short wavelength area at the gas upstream side can be changed into a longer wavelength area.

FIG. 8B shows the PL wavelength distribution when the wafer holder according to this embodiment is used. From the PL wavelength distribution shown in FIG. 8B, it can be seen that as compared with the case of FIG. 8A, the center of the distribution shifts towards the wafer center and so the flat distribution area is enlarged. Thus, when the wafer holder according to this embodiment is used, the PL wavelength distribution can be improved in the device area (standard deviation: 3.8→2.8 nm) and the entire wafer (standard deviation: 5.9→5.4 nm).

In this way, in comparison to the PL distribution when the conventional wafer holder is used as shown in FIG. 8A, because of a reduction in the surface temperature at the gas upstream side, the PL wavelength distribution at the device area can be made flat as shown in FIG. 8B.

The compound semiconductor crystal fabricated when the wafer holder according to this embodiment is used has a restricted composition distribution in the wafer and with very high uniformity. This provides a large number of chips of compound semiconductor devices such as semiconductor lasers, from one sheet of wafer, thereby leading to cost reduction. It is apparent that the compound semiconductor devices fabricated by the wafer holder according to this embodiment provides uniform device characteristics and improved production yield.

(Embodiment 3)

In Embodiments 1 and 2, giving attention to a temperature difference between a gas upstream position and a gas downstream position, semi-circular concavities 3 and 4 were formed within the wafer pockets or opposite their backsides. On the other hand, this embodiment responds to a temperature difference between a molybdenum-exposed area where no wafer is present and the surface of the wafer located on the wafer holder, and proposes a structure for eliminating that temperature difference.

Figure 9:
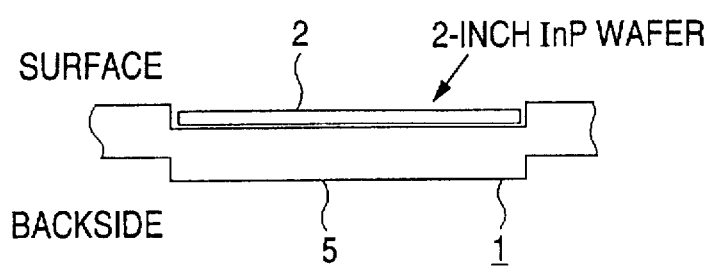
FIG. 9 is a partial sectional view showing the shape of a wafer holder used in a vapor-phase growth apparatus according to the third embodiment.

FIG. 9 is a partial sectional view showing the configuration of the wafer holder which is used in the MOCVD growth apparatus according to the third embodiment. In FIG. 9, reference numeral 5 denotes a convexity formed over the entire area on the backside of the wafer holder 1 opposite the wafer pocket.

Figure 10:
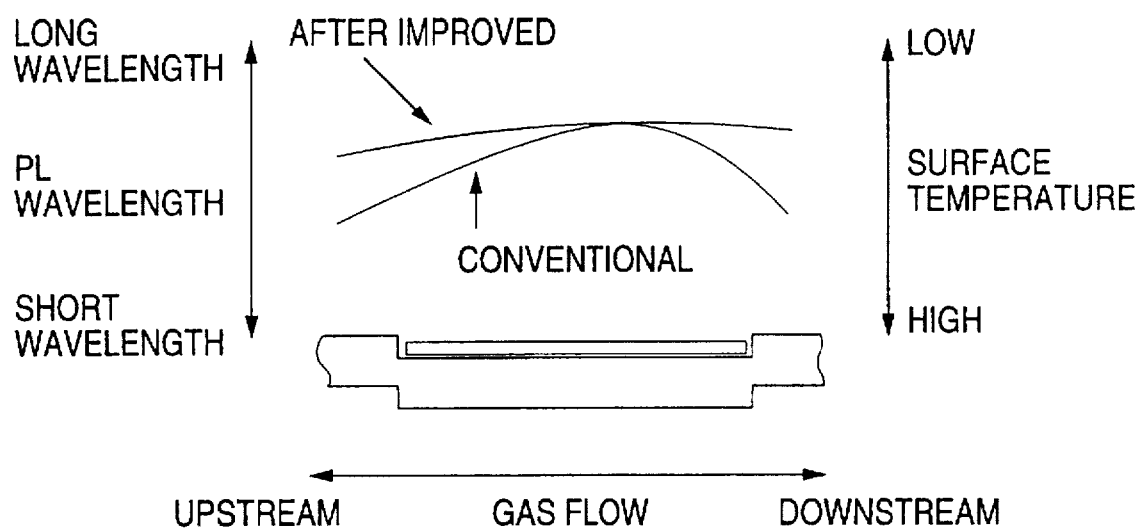
FIG. 10 is a graph showing the profile of the surface temperature of a wafer when the wafer holder is used in the vapor-phase growth apparatus according to a third embodiment of the present invention.
Figure 11:
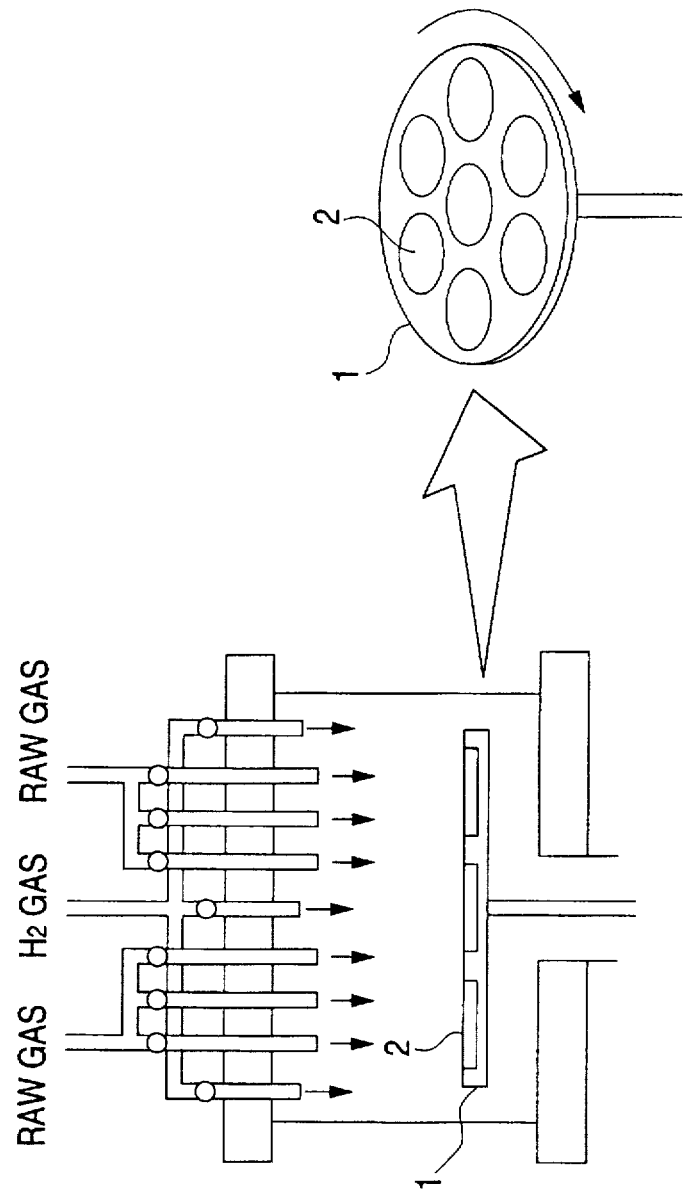
FIG. 11 is a schematic view of an MOCVD growth apparatus having a thermal radiation type substrate heating system.
Figure 12:
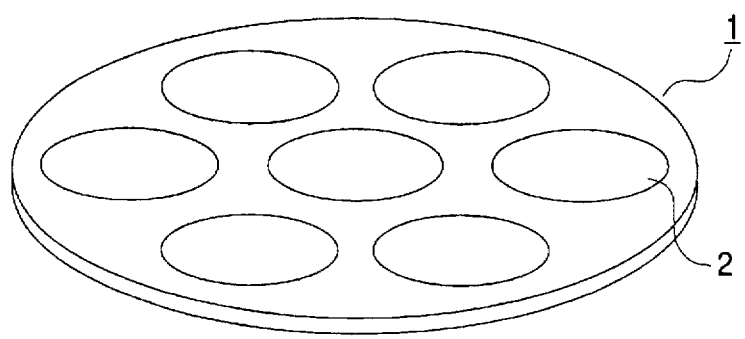
FIG. 12 is a perspective view showing a wafer holder used in the conventional vapor-phase growth apparatus.
Figure 13:
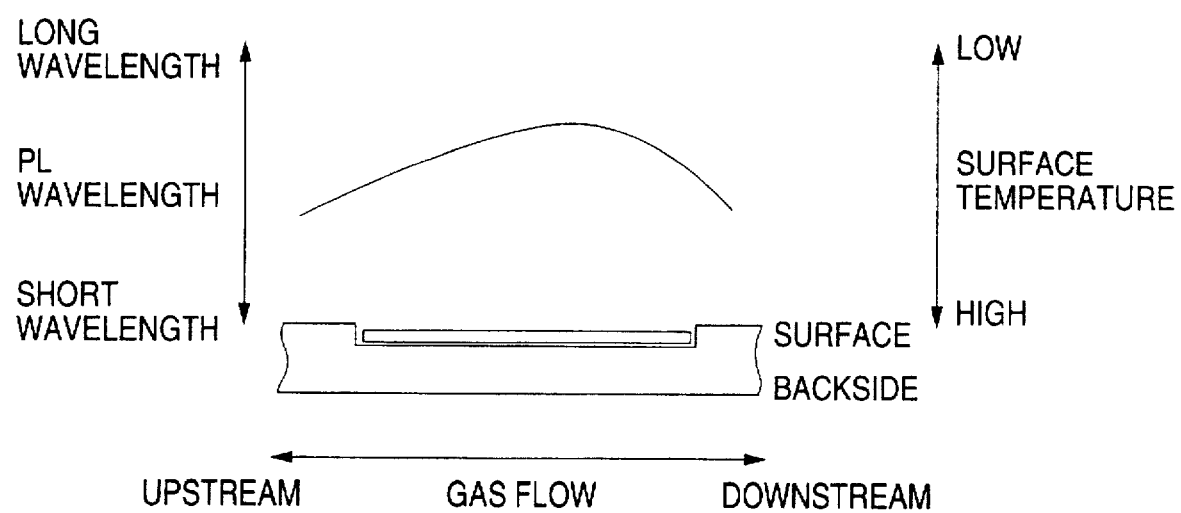
FIG. 13 is a graph showing the profile of the surface temperature of a wafer when the wafer holder for the conventional vapor-phase growth apparatus is used.

This embodiment, which includes a convexity 5 on the backside of the wafer holder 1, eliminates a temperature difference between the respective surfaces of the wafer holder and wafer. Giving a greater thickness to the wafer pocket 2 area of the wafer holder 1 than before permits the distance from the wafer heater placed on the backside of the wafer holder to be shorter than from the area of the backside of the wafer holder other than the convexity 5, thus enabling the surface temperature of the wafer on the wafer pocket 2 to be increased. As a result, the temperature difference between the wafer surface and the molybdenum-exposed portion where no wafer is present can be eliminated, and an increase in the temperature in the wafer periphery can be suppressed as shown in FIG. 10. Thus, P-richness in the wafer periphery can be suppressed.

A compound semiconductor crystal fabricated when the wafer holder according to this embodiment is used has a restricted composition distribution within the wafer and very high uniformity. This provides a large number of chips of compound semiconductor devices, such as semiconductor lasers, from one wafer, thereby leading to cost reduction. It is apparent that the compound semiconductor devices fabricated by the wafer holder according to this embodiment have uniform device characteristics and improved production yield.

As described above, in the vapor phase growth device according to the present invention, provision of concavities or convexities within the spot facing or the backside of the wafer holder makes uniform the surface temperature of the wafer. This realizes great improvement in the uniformity of the composition of a compound semiconductor crystal within the wafer, improving the yield in the compound semiconductor device and greatly reducing production cost.

What is claimed is:

1. A vapor-phase growth apparatus comprising:

a vapor-phase reactor chamber including a reaction gas inlet for supplying a gas in a gas flow direction within said vapor-phase reactor chamber, and an exhaust pipe;

a wafer holder disposed in said vapor-phase reactor chamber and having a recess in a front side for receiving and supporting a wafer horizontally and contacting substantially all of a rear surface of the wafer, said wafer holder including a concavity in a back side of said wafer holder opposite only part of the recess;

a wafer heater located at a back side of said wafer holder for heating said wafer holder and a wafer disposed in the recess; and driving means for rotating said wafer holder about an axis outside the recess in a direction of rotation wherein the direction of rotation and the direction of gas flow are opposite so that the concavity intersects the gas flow substantially simultaneously with the recess and the recess continues to intersect the gas flow after the concavity no longer intersects the gas flow whereby the uniformity of the surface temperature of a wafer placed in the recess is improved.

2. The vapor-phase growth apparatus of claim 1 wherein the recess is substantially circular, the concavity is substantially semi-circular, and the recess and the concavity have a common axis.

* * * * *